(12) United States Patent
Chen et al.

(10) Patent No.: US 8,809,083 B2
(45) Date of Patent: Aug. 19, 2014

(54) METHOD OF MANUFACTURING LIGHT EMITTING DIODE

(71) Applicant: Advanced Optoelectronic Technology, Inc., Hsinchu Hsien (TW)

(72) Inventors: Lung-Hsin Chen, Hsinchu (TW); Wen-Liang Tseng, Hsinchu (TW)

(73) Assignee: Advanced Optoelectronics Technology, Inc., Hsinchu Hsien (TW)

( * ) Notice: Subject to any disclaimer, the term of this patent is extended or adjusted under 35 U.S.C. 154(b) by 0 days.

(21) Appl. No.: 13/787,748

(22) Filed: Mar. 6, 2013

(65) Prior Publication Data

US 2013/0244358 A1    Sep. 19, 2013

(30) Foreign Application Priority Data

Mar. 13, 2012 (CN) .......................... 2012 1 0064643

(51) Int. Cl.
*H01L 21/00* (2006.01)
*H01L 33/52* (2010.01)
*H01L 33/00* (2010.01)

(52) U.S. Cl.
CPC ............ *H01L 33/52* (2013.01); *H01L 33/0095* (2013.01); *H01L 2933/0041* (2013.01)
USPC ........................................................ 438/28

(58) Field of Classification Search
CPC ..... H01L 33/486; H01L 33/62; H01L 33/483; H01L 2924/12041; H01L 23/043; H01L 23/053; H01L 23/06; H01L 23/552; H01L 2933/0041; H01L 33/0095; H01L 33/52
See application file for complete search history.

(56) References Cited

U.S. PATENT DOCUMENTS

| 5,252,850 | A | * | 10/1993 | Schempp ....................... 257/433 |
| 2010/0059782 | A1 | | 3/2010 | Fujitomo et al. |
| 2010/0181582 | A1 | | 7/2010 | Li et al. |
| 2011/0303936 | A1 | * | 12/2011 | Wu ................................. 257/98 |
| 2012/0107975 | A1 | * | 5/2012 | Chan et al. ..................... 438/27 |
| 2013/0032842 | A1 | * | 2/2013 | Park et al. ....................... 257/98 |
| 2013/0178003 | A1 | * | 7/2013 | Chen et al. ..................... 438/27 |
| 2013/0280834 | A1 | * | 10/2013 | Lo et al. ......................... 438/27 |
| 2013/0288408 | A1 | * | 10/2013 | Chang et al. ................... 438/27 |

FOREIGN PATENT DOCUMENTS

| KR | 2007075574 | A | * | 7/2007 |
| TW | 201019511 | A1 | | 5/2010 |
| TW | 201112454 | A1 | | 4/2011 |
| TW | 201112456 | A1 | | 4/2011 |

* cited by examiner

*Primary Examiner* — Zandra Smith
*Assistant Examiner* — Sophia Nguyen
(74) *Attorney, Agent, or Firm* — Novak Druce Connolly Bove + Quigg LLP

(57) ABSTRACT

A method of manufacturing a light emitting diode (LED) comprising: providing a porous carrier, a base disposed on the carrier and a plurality of light emitting elements mounted on the base, wherein the carrier defines a plurality of micro through-holes extending through a first face to a second face of the carrier, and the base has electrical structures formed thereon electrically connecting to the light emitting elements, respectively; providing a mold to receive the carrier therein and distributing a phosphor glue on the base to cover the light emitting elements, and the mold defining an air outlet communicated with the through-holes of the carrier; vacuuming the mold via the air outlet to flatten an outer face of the phosphor glue; heating the phosphor glue and removing the mold; and removing the carrier.

11 Claims, 8 Drawing Sheets

METHOD OF MANUFACTURING LIGHT EMITTING DIODE

BACKGROUND

1. Technical Field

The present disclosure relates generally to light emitting diode(LED) packages, and more particularly to a method of manufacturing a light emitting diode.

2. Description of Related Art

LEDs are solid state light emitting devices formed of semiconductors, which are more stable and reliable than other conventional light sources such as incandescent bulbs. Thus, LEDs are being widely used in various fields such as numeral/character displaying elements, signal lights, light sources for lighting and display devices. In use, providing LEDs in packages can provide protection, color selection, focusing and the like for light emitted by the LEDs. Generally, a process of packaging an LED chip includes bonding, encapsulating, baking, cutting etc.

In a typical encapsulating process, the dispensing machine dispenses amount of phosphor glue containing phosphor scattered therein on a base to encapsulate LED chips mounted on the base. However, the phosphor glue is prone to form an uneven thickness distribution due to surface tension of the viscosity of the glue. Therefore, such a method is difficult to satisfy uniform light distribution requirement.

What is needed therefore is a method of manufacturing an LED which can overcome the above mentioned limitations.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the views.

DETAILED DESCRIPTION

Figure 1:
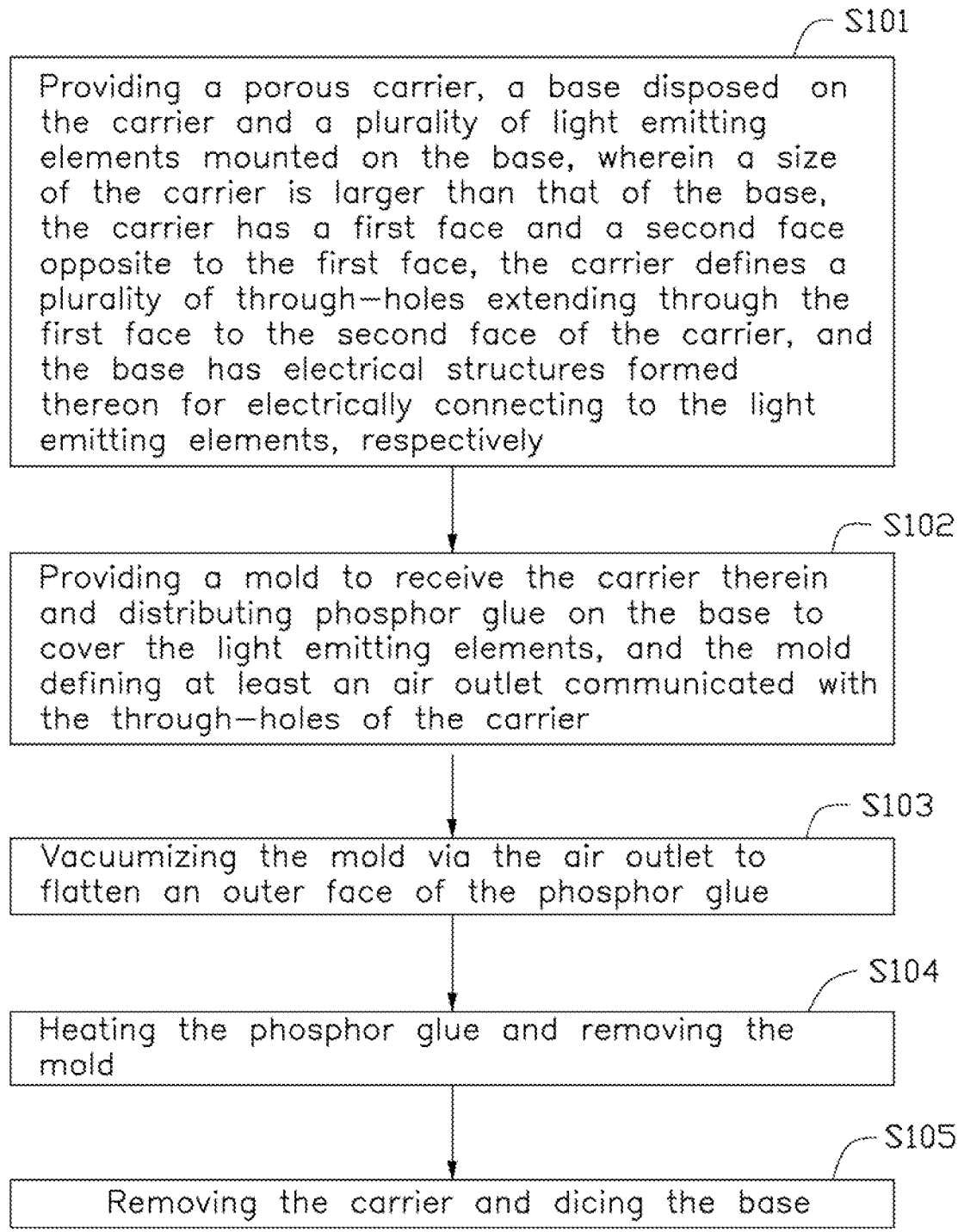
FIG. 1 is a flow chart of a method of manufacturing a light emitting diode in accordance with an embodiment of the present disclosure.

FIG. 1 illustrates a flow chart of a method of manufacturing a light emitting diode (LED). The method includes the following steps:

Step A (also referring to FIG. 2), a porous carrier 40 is provided, a base 10 is disposed on the carrier 40 and a plurality of light emitting elements 30 are mounted on the base 10. The carrier 40 is larger than the base 10. The carrier 40 has a first face 41 and a second face 42 opposite to the first face 41. The carrier 40 defines a plurality of micro through-holes 401 extending through the first face 41 to the second face 42. The base 10 has electrical structures 20 formed thereon for electrically connecting to the light emitting elements 30, respectively;

Step B (also referring to FIG. 3), a mold 60 is provided to receive the carrier 40 therein and a phosphor glue 80 is distributed on the base 10 to cover the light emitting elements 30;

Step C (also referring to FIG. 5), the mold 60 is vacuumed via the through-holes 401 of the carrier 40, whereby an outer face of the phosphor glue 80 is flattened;

Step D, the phosphor glue 80 is heated until the phosphor glue 80 is solidified, and the mold 60 is removed;

Step E, the carrier 40 is removed.

Figure 2:
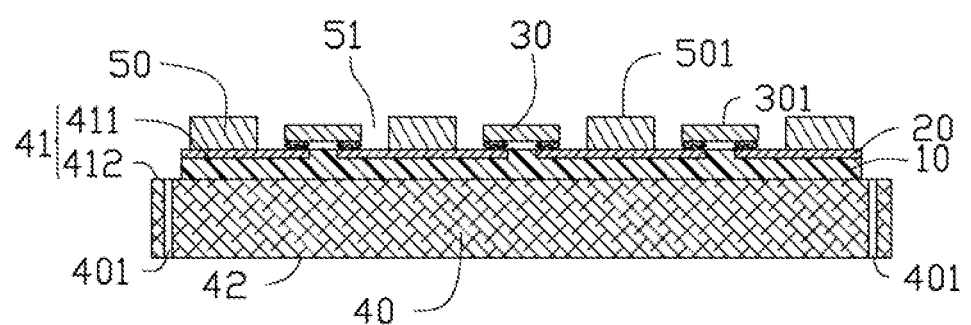
FIGS. 2-3 and 5-8 are cross sectional views of a light emitting diode obtained by different steps of the method shown in FIG. 1.

The present disclosure now will be described in detail hereinafter with reference to FIGS. 2-8. Referring to FIG. 2, the first face 41 comprises a first area 411 and a second area 412 joined with and surrounding the first area 411. The base 10 is disposed on the first area 411 of the first face 41 of the carrier 40. The through-holes 401 extend from the second area 412 of the first face 41 to the second face 42. The through-holes 401 can be formed in a variety of ways, such as mechanical drilling, laser drilling, or etching, etc. The through-holes 401 are communicated with each other via a plurality of micro voids (not labeled) in the porous carrier 40.

A mask 50 is formed on the base 10. The mask 50 defines a plurality of holes 51 to receive the light emitting elements 30 therein. The mask 50 comprises a top face 501 away from the base 10. The top face 501 is higher than the light-emitting face 301 of the light emitting elements 30.

The light emitting elements 30 are directly and electrically connected to the electrical structures 20, respectively. The light emitting elements 30 may also be electrically connected to the electrical structures 20 of the base 10 via wires (not shown). In the present embodiment, the light emitting elements 30 are LEDs. It is understood that, ultraviolet, blue and/or green LEDs may be provided.

Figure 3:
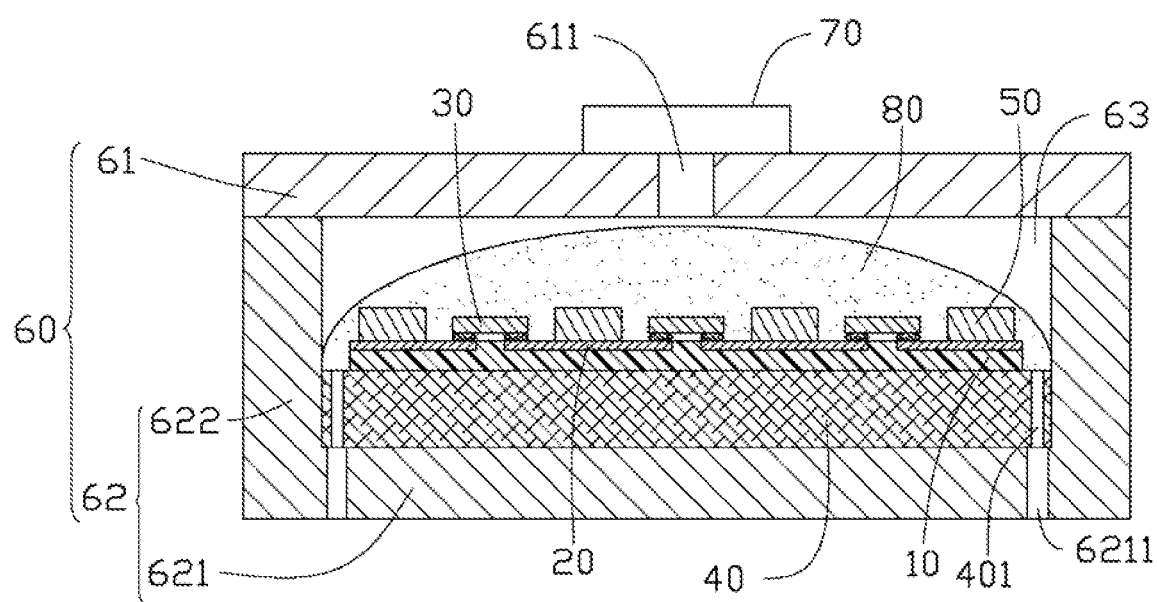
Figure 4:
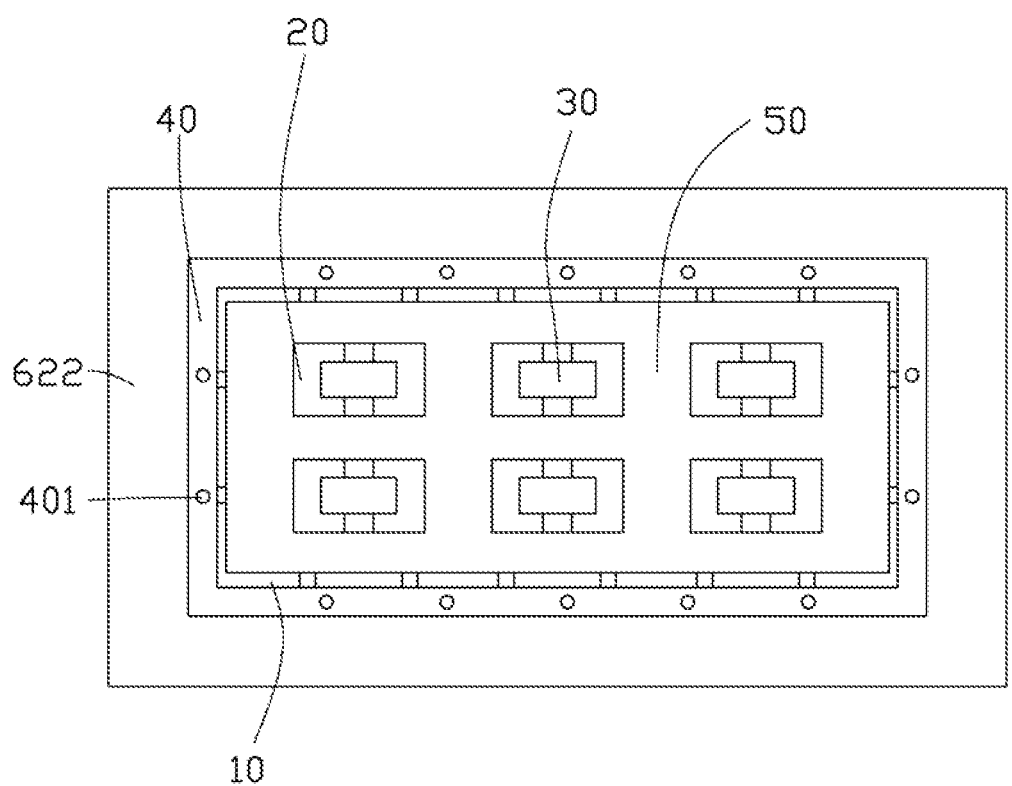
FIG. 4 is a top view of FIG. 3 with an upper mold section, a pressure pump and a phosphor glue being removed for clarity.

Referring to FIGS. 3-4, the mold 60 comprises an upper mold section 61 and a lower mold section 62 hermetically sealed with the upper mold section 61. The upper mold section 61 and the lower mold section 62 cooperatively define an interior chamber 63 to receive the carrier 40 therein.

The lower mold section 62 comprises a supporting plate 621 and a surrounding wall 622 extending upwardly from an outer periphery of the supporting plate 621. The carrier 40 is fixed on the supporting plate 621 and surrounded by the surrounding wall 622. The supporting plate 621 also defines two air outlets 6211 in communication with two of the through-holes 401 of the carrier 40. Alternatively, the number of the air outlet 6211 can be one or more than two, according to the actual requirement. The upper mold section 61 defines an air inlet 611 communicating the interior chamber 63 with an outside of the mold 60. A pressure pump 70 in communication with the air inlet 611 is fixed on the upper mold section 61 to introduce high pressure air flow into the chamber 63 via the air inlet 611. Alternatively, the air inlet 611 and the corresponding pressure pump 70 each can have a number more than one, according to the actual requirement.

The phosphor glue 80 is dispensed on the base 10 until the phosphor glue 80 flows around to encapsulate the light emitting elements 30 and mask 50. In a preferred embodiment, the phosphor glue 80 is dispensed on the base 10 fixed in the lower mold section 62 by a glue dispenser (not shown) before the upper mold section 61 is engaged with the lower mold section 62. In other embodiment, the phosphor glue 80 could be injected into the mold 60 to encapsulate the light emitting elements 30 and mask 50 via the air inlet 611 of the upper mold section 61.

Figure 5:
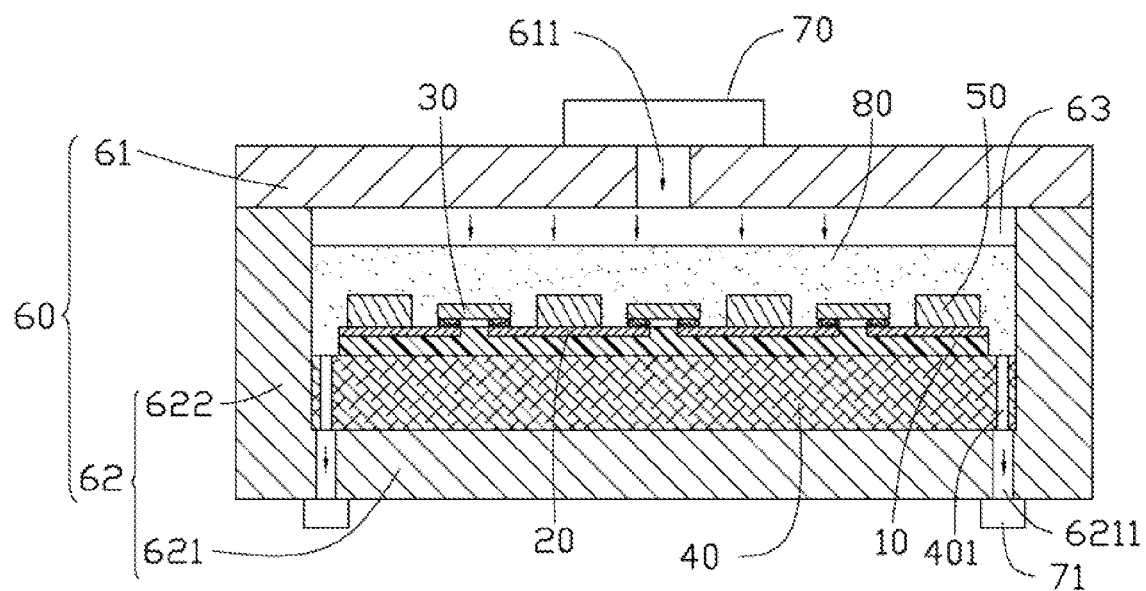

Referring to FIG. 5, two vacuuming apparatuses 71 are provided. The vacuuming apparatuses 71 are disposed on the supporting plate 621 of the lower mold section 62. Each of the vacuuming apparatuses 71 is communicated with one corresponding air outlet 6211 for vacuuming the interior chamber 63 therefrom. In a process of vacuuming, the phosphor glue 80 flows around on the base 10 and penetrates into the through-holes 401 of the carrier 40 by air pressure difference existed between upside and downside of the carrier 40, whereby an outer face of the phosphor glue 80 is flattened, and an uniform thickness of the phosphor glue 80 is obtained. In a preferred embodiment, the pressure pump 70 injects high pressure air flow via the air inlet 611 into the mold 60 to generate positive air pressure in the interior chamber 63 above the phosphor glue 80 to facilitate the outer (top) face of the phosphor glue 80 to become flat quickly.

And then, the mold 60 is heated to solidify the phosphor glue 80 for encapsulating the light emitting elements 30. Thereafter, the mold 60 together with the pressure pump 70 and the vacuuming apparatuses 71 is removed.

Figure 6:
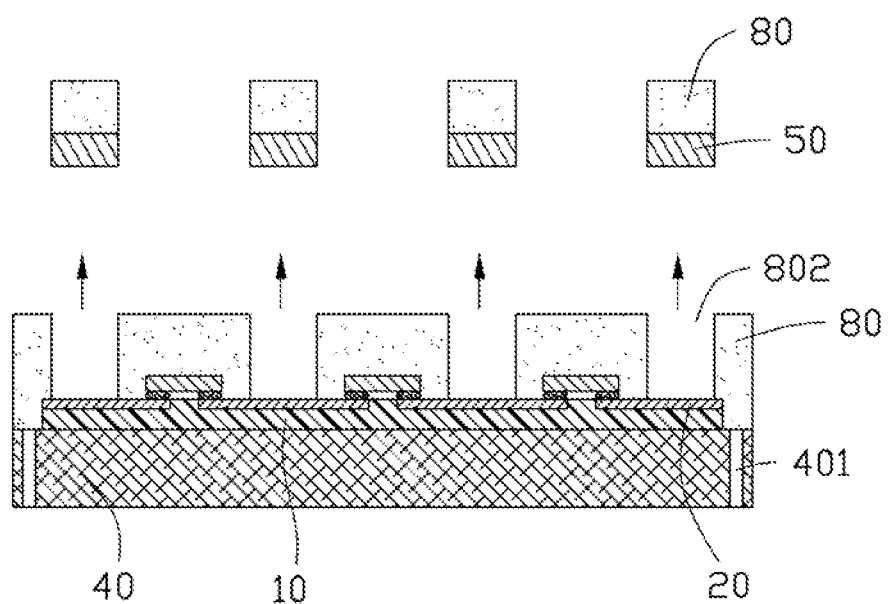

Referring to FIG. 6, the mask 50 is separated from the base 10 by cutting the solid phosphor glue 80 to reach the mask 50 along a cutting line (not shown) aligned with an edge of the mask 50 defining the holes 51. The remaining solid phosphor glue 80 defines a plurality of intercrossing grooves 802 after the removal of the mask 50 and a part of the solid phosphor glue 80 above the mask 50.

Figure 7:
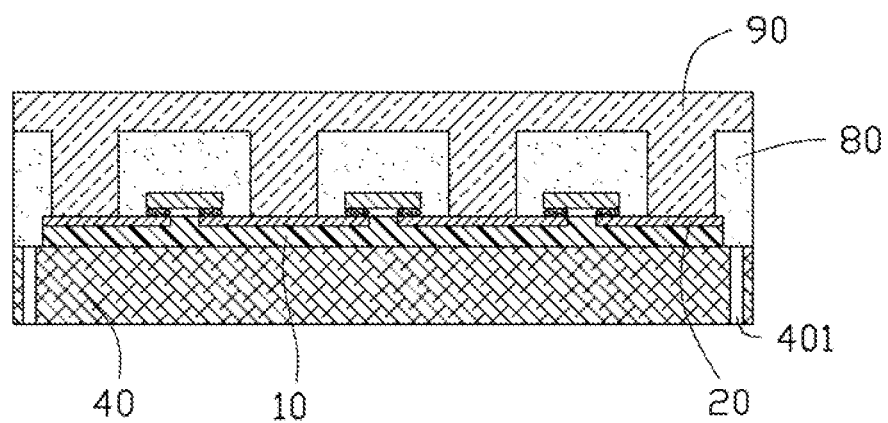

Referring to FIG. 7, the solid phosphor glue 80 is encapsulated by an encapsulant layer 90. The encapsulant layer 90 may contain YAG phosphors, silicon oxynitride phosphors, or nitride phosphors, etc. The encapsulant layer 90 is positioned on the phosphor glue 80 and fills the grooves 802.

Figure 8:
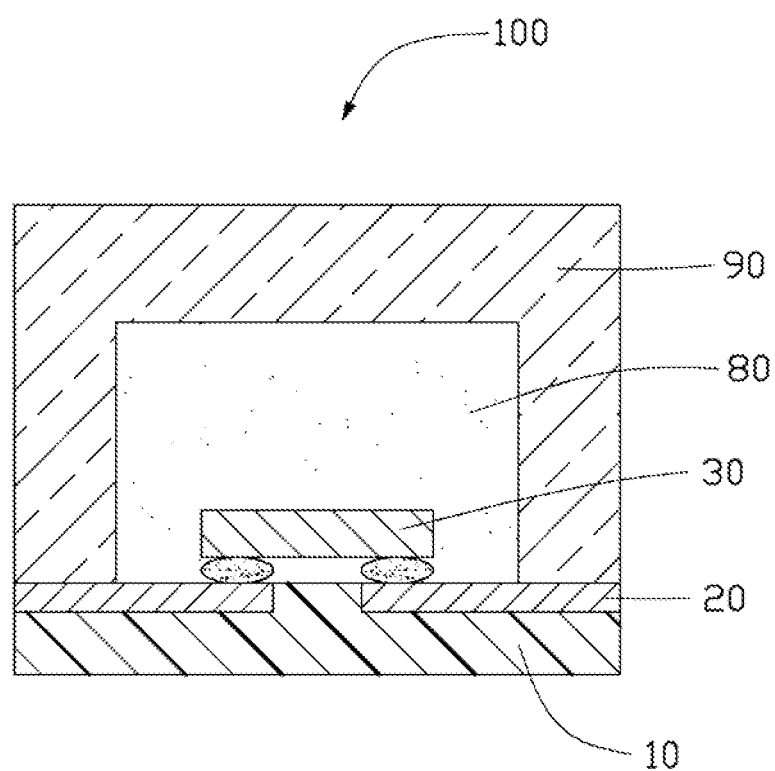

Referring to FIG. 8, the carrier 40 is removed, and the encapsulation layer 90 and the base 10 are cut along middle lines of the grooves 802 to form a plurality of individual LED packages 100.

It is believed that the present embodiments and their advantages will be understood from the foregoing description, and it will be apparent that various changes may be made thereto without departing from the spirit and scope of the disclosure or sacrificing all of its material advantages, the examples hereinbefore described merely being preferred or exemplary embodiments of the disclosure.

What is claimed is:

1. A method of manufacturing a light emitting diode (LED) comprising:
   providing a porous carrier, a base disposed on the carrier and a plurality of light emitting elements mounted on the base, wherein the carrier is larger than the base, the carrier has a first face and a second face opposite to the first face, the carrier defines a plurality of micro through-holes extending through the first face to the second face of the carrier, and the base has electrical structures formed thereon electrically connecting to the light emitting elements, respectively;
   providing a mold to receive the carrier therein and distributing a phosphor glue on the base to cover the light emitting elements, and the mold defining at least an air outlet communicated with the through-holes of the carrier;
   vacuuming the mold via the air outlet to flatten an outer face of the phosphor glue which is distant from the base;
   heating the phosphor glue and removing the mold; and
   removing the carrier.

2. The method of claim 1, further comprising a step of encapsulating the phosphor glue with an encapsulant layer after heating the phosphor glue and removing the mold.

3. The method of claim 1, wherein the first face of the carrier comprises a first area and a second area joined with and surrounding the first area, the base is positioned on the first area, and the through-holes extend from the second area of the first face to the second face of the carrier.

4. The method of claim 1, further comprising a step of forming a mask on the base, the mask defining a plurality of holes to receive the light emitting elements therein.

5. The method of claim 4, wherein a top face of the mask is away from the base and higher than a light-emitting face of the light emitting elements.

6. The method of claim 4, wherein the mask is encapsulated by the phosphor glue after the step of distributing a phosphor glue on the base to cover the light emitting elements.

7. The method of claim 6, further comprising a step of removing the mask from the base after heating the phosphor glue.

8. The method of claim 7, further comprising a step of cutting the phosphor layer to the mask along a line aligned with an edge of the mask defining the holes for the removal of the mask from the base.

9. The method of claim 1, wherein the mold comprises an upper mold section and a lower mold section hermetically sealed with the upper mold section, and the carrier is fixed in the lower mold section.

10. The method of claim 9, wherein the upper mold section defines at least an air inlet to communicate an inside and an outside of the mold, and a pressure pump communicated with the air inlet is fixed at the upper mold section and injects high pressure air flow into the inside of the mold via air inlet during the vacuuming of the mold.

11. The method of claim 1, further comprising a step of cutting the base to form a plurality of individual LED packages after removing the carrier, wherein each individual LED package includes a corresponding light emitting element.

\* \* \* \* \*